US006919102B2

United States Patent
Chen

(10) Patent No.: US 6,919,102 B2
(45) Date of Patent: Jul. 19, 2005

(54) METHOD OF STABILIZING MATERIAL LAYER

(75) Inventor: Ching-hua Chen, Hsinchu (TW)

(73) Assignee: Powerchip Semiconductor Corp., Hsinchu (TW)

(*) Notice: Subject to any disclaimer, the term of this patent is extended or adjusted under 35 U.S.C. 154(b) by 18 days.

(21) Appl. No.: 10/250,292

(22) Filed: Jun. 20, 2003

(65) Prior Publication Data
US 2004/0258840 A1 Dec. 23, 2004

(51) Int. Cl.[7] ............................................. C23C 16/34
(52) U.S. Cl. ..................... 427/255.36; 427/255.37; 427/255.392; 427/255.394; 427/255.5; 438/680
(58) Field of Search .................. 427/255.37, 255.36, 427/255.392, 255.394, 255.5; 438/680

(56) References Cited

U.S. PATENT DOCUMENTS

| | | | | |
|---|---|---|---|---|
| 5,851,921 A | * | 12/1998 | Gardner et al. | 438/655 |
| 5,988,233 A | * | 11/1999 | Fosnight et al. | 141/63 |
| 6,187,631 B1 | * | 2/2001 | Harshfield | 438/255 |
| 6,191,018 B1 | * | 2/2001 | Yue et al. | 438/592 |
| 6,448,655 B1 | * | 9/2002 | Babich et al. | 257/759 |
| 6,716,651 B2 | * | 4/2004 | Weng et al. | 438/14 |
| 2002/0187631 A1 | * | 12/2002 | Kim et al. | 438/637 |
| 2004/0182472 A1 | * | 9/2004 | Aggarwal | 141/98 |

FOREIGN PATENT DOCUMENTS

| | | |
|---|---|---|
| TW | 313149 | 8/1997 |
| TW | 396555 | 7/2000 |

* cited by examiner

Primary Examiner—Timothy Meeks
(74) Attorney, Agent, or Firm—Jiang Chyun IP Office

(57) ABSTRACT

A method of stabilizing the properties of a material layer is disclosed. A plurality of wafers are stored in a FOUP and in sequence the wafers are transferred to a chamber to proceed with deposition of a material layer and to the FOUP filled with a specific gas after deposition until all the wafers in the FOUP are treated. In the process of deposition, the wafers deposited with material layers on their surfaces are stored in the FOUP filled with specific gas. Therefore, the surface properties of all the wafers in the FOUP are stablilized and contamination due to outgassing is prevented.

9 Claims, 1 Drawing Sheet

METHOD OF STABILIZING MATERIAL LAYER

BACKGROUND OF INVENTION

1. Field of the Invention

The present invention relates to a method of manufacture for a semiconductor device, particularly a method of stabilizing surface properties of a material layer.

2. Description of the Related Art

Film deposition is one of the important steps in semiconductor device fabrication process. Generally, a semiconductor device is constituted from a plurality of layers (material layers) of films of various thickness. The stability of these films (material layers) will affect the performance of the semiconductor device. Therefore, in semiconductor fabrication process, how to stabilize the surface properties of the material layers is important.

For instance, in general, in the process of depositing material layers, a plurality of wafers are stacked and placed in a Front Opening Unified Pod, FOUP. A robot arm is used to take the wafers, in sequence, from the FOUP and transfer the wafers to a chamber to proceed with the deposition of the material layers. After that the wafers having been deposited with material layers are delivered to the FOUP again. Since the FOUP is under normal pressure, when the first wafer is transferred back to the FOUP, the wafer is transferred from an almost vacuum environment to that of atmospheric pressure, and the film surface will oxidize with oxygen within the atmosphere. This oxidation reaction will increase the resistance value of the wafer. Further, the extent of oxidation of each wafer is different with respect to duration of storage. In other words, the surface properties of the material layer on the first wafer will be different from that of the last wafer. Such a difference affects the subsequent fabrication process to a certain extent, and consequently the yield and stability of the semiconductor device will be affected.

Besides, when the wafer deposited with material layers is placed in the FOUP for storage, the residual gas will be released from the wafer surface (known as outgassing). This gas dispersed from the wafer will contaminate the untreated wafer surface. When these contaminated wafers proceed to material layer deposition, the material layer possesses the original material and the contaminant adhered onto the wafer. Thus, the yield of product will be lowered. Accordingly, it is an object of the present invention to provide a method of stabilizing surface properties of the material layer and at the same time lowering contamination of wafer caused by outgassing.

SUMMARY OF INVENTION

Accordingly, it is an object of the present invention to provide a method of stabilizing material layers, wherein wafers are stored in the FOUP filled with gas to stabilize the properties of the material layers on the wafer, avoiding inconsistency of properties of the surface of individual wafers as a result of the difference caused by oxidation.

Yet another object of the present invention is to provide a method of stabilizing a material layer, wherein the wafers with deposited a material layer are stored in a FOUP filled with gas so as to reduce outgassing as a result of the residual gas on the wafer, avoiding the outgassing contamination of the untreated wafer in the FOUP.

The present invention provides a method of stabilizing material layers by transferring a wafer to a chamber to form a material layer, wherein the material of the material layer is selected from the group consisting of metal, metal nitrides, metal silicides or oxides. Next, the wafer deposited with material layer is transferred to a FOUP filled with gas for storage, wherein the filled gas is, for example inert gas or oxygen. When an inert gas is used to fill the FOUP, the oxidizing situation on the wafer surface can be retarded, and the increased resistance value due to oxidation can be reduced such that the surface properties of the material layer on the wafer surface are more stable. By way of purging with nitrogen, the deposited reacting residual gas from the FOUP is removed so as to lower contamination on the wafer as a result of outgassing. Besides, when oxygen is filled in the FOUP, the extent of oxidation of the material layer surface is increased such that the resistance value becomes greater. Thus, the stability of the surface properties of the wafer in the FOUP is increased. Of course, by means of purging with oxygen, the reacting residual gas will be discharged from the FOUP so as to reduce contamination on other wafers as a result of outgassing.

The present invention also provides a method of stabilizing surface properties of the material layer, wherein a plurality of wafers are placed in the FOUP and the wafers are in sequence transferred to a chamber to form a material layer, wherein the material of the material layer is selected from the group consisting of metal, metal nitrides, metal silicides or oxide. Next, the wafers deposited with material layer are in sequence transferred to a FOUP filled with gas, wherein during the process of fabricating the first wafer and the last wafer, the FOUP is filled with a gas, thus, the material layer is stabilized so that the surface properties of the first wafer to the last wafer in the FOUP are the same.

Another object of the present invention is to provide a method of stabilizing the material layer, wherein the deposited wafer is placed in the FOUP filled with inert gas so as to reduce oxidation of the wafer surface deposited with material layer, caused by the contact with the atmosphere.

A further object of the present invention is to provide a method of stabilizing the material layer, wherein the deposited wafer is stored in a FOUP filled with oxygen so as to accelerate oxidation of the material layer deposited wafer surface, stabilizing the material layer.

Still another object of the present invention is to provide a method of stabilizing the material layer, wherein the deposited wafer is stored in a FOUP filled with gas so as to remove the residual gas to reduce contamination on the untreated wafer surface as a result of outgassing.

In accordance with the present invention, gas is passed to the FOUP without addition of expensive devices, and the above drawbacks of the conventional art are overcome without increase in the cost of production. Thus, the present invention effectively increases the yield and the stability of the wafer.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve the principles of the invention.

DETAILED DESCRIPTION

Figure 1:
FIG. 1 is a schematic view showing a fabrication device for forming a material layer of a preferred embodiment in accordance with the present invention.

Reference will now be made in detail of the present preferred embodiments of the invention, examples of which are illustrated in the accompanying drawings. Wherever possible, the same reference numbers are used in the drawings and the description to refer to the same or like parts.

Figure 2:
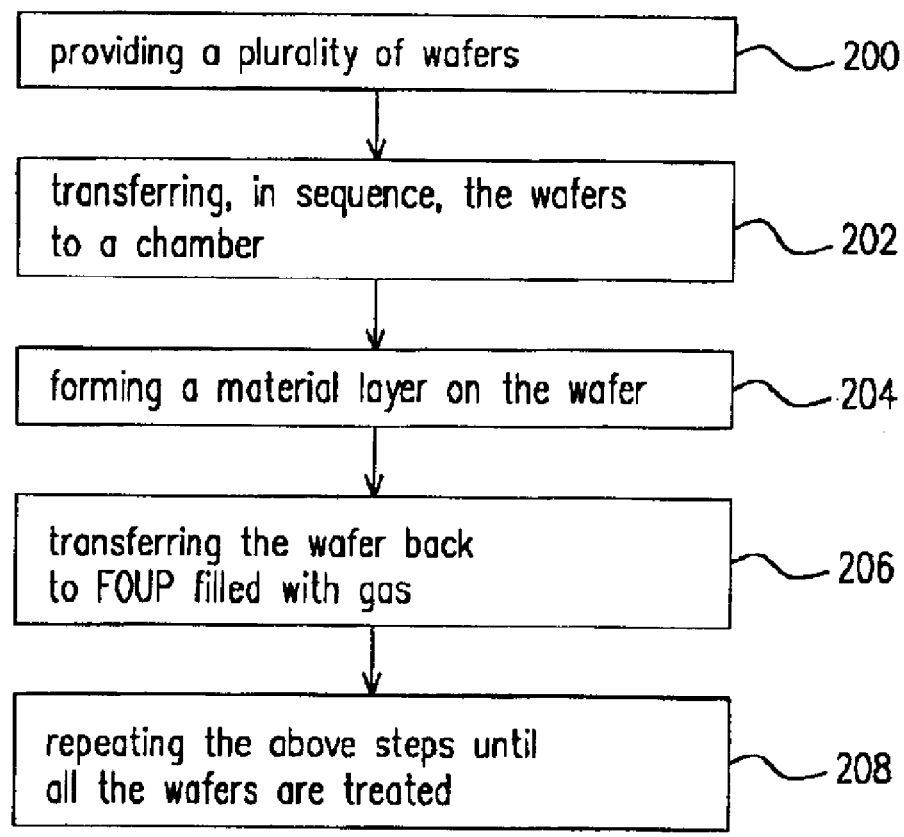
FIG. 2 is a flow chart showing formation of the material layer of the preferred embodiment in accordance with the present invention.

FIG. 1 schematically shows a fabrication device for forming of the material layer of a preferred embodiment of the present invention. FIG. 2 is a flowchart showing a method of forming a material layer of the preferred embodiment in accordance with the present invention.

Referring to FIGS. 1 and 2, step 200 indicates the step of providing a plurality of wafers, and the wafers are kept in the FOUP 100. An example of a FOUP 100 is the FOUP that can store 25 wafers. After that, a robot blade is used to respectively transfer the wafers from the FOUP 100 to a chamber (step 202). In other words, the wafers in the FOUP 100 are transferred, one-by-one, to the chamber 102 to proceed with reaction. The chamber 102 is, for example, chemical vapor deposition (CVD) chamber, sputtering chamber, evaporized-sputtering chamber, or hot furnace tube chamber.

After the wafers have been transferred to the chamber 102, a deposition process is carried out in the chamber 102, and a material layer is formed on the wafer (step 204), wherein the material for the material layer includes metal nitrides, metal silicides or oxides. Metal nitrides include titanium nitride, and metal layers include tungsten, copper or titanium, etc. Metal silicides include tungsten silicide, titanium silicide or tantalum silicide. An example of oxide includes silicon oxide.

Next, after the deposition of the material layer is completed, the wafer transferred from the chamber 102 to the FOUP 100 (step 206) for storage. After that, repeat steps 200 to 206 by transferring other wafers in the FOUP 100 in sequence to the chamber 102 to proceed with reaction until all the wafers in the FOUP 100 have been deposited with the material layer. In the process of deposition reaction of the first wafer in the FOUP 100 to the last wafer in the FOUP 100, the FOUP 100 is filled with a gas which can accelerate or avoid oxidation of the material layer so as to stabilize the material layer. Gas enters the FOUP 100 via an inlet 104 connected to a gas supply device (not shown). The supplied gas is, for instance, inert gas (including nitrogen, helium, argon, etc) or oxygen. When the gas enters the FOUP 100, the gas originally existing in the FOUP 100 is discharged via an outlet 106 so that the supplied gas from the gas supply device (not shown) fills up the FOUP 100. Thus, the properties of the material layer are stabilized and the first wafer in the FOUP 100 and the last wafer in the FOUP 100 have similar properties.

In accordance with the above preferred embodiment, after deposition has been completed, the wafer is placed into the same FOUP. The present invention is not limited to this but the description is a preferred embodiment for description. After the deposition has been completed, the wafer is moved to another FOUP filled with gas, or other environment with gas. Similarly, the properties of the material layer can be stabilized.

The method of the present invention is not restricted only to the deposition process. After the wafer has proceeded to thermal treatment fabrication (reflow treatment), the wafer is transferred to a FOUP filled with gas or other environment filled with gas. Similarly, the properties of the material layer can be stabilized.

In accordance with the present invention, fabrication of a titanium nitride material layer is used for explanation. Referring to FIGS. 1 and 2, step 200 indicates the step of providing a plurality of wafers and the wafers are stored in the FOUP 100. Example of a FOUP 100 is the FOUP that can store 25 wafers. After that, a robot blade is used to transfer the wafers in sequence from the FOUP 100 to a chamber 102 (step 202). The chamber 102 is, for example, a chemical vapour deposition (CVD) chamber.

Next, after the wafers have been transferred to the chamber 102, deposition of a titanium-nitride layer is carried out in the chamber 102 (step 204), wherein the gas for titanium nitride deposition is titanium chloride and ammonia gas, titanium chloride and hydrogen/nitrogen or titanium chloride and ammonia/hydrogen.

Next, after the deposition of the material wafer is completed, the wafer is transferred from the chamber 102 to the FOUP 100 (step 206) for storage using robot blade. After that, repeat steps 200 to 206 by transferring other wafers in the FOUP 100 in sequence to the chamber 102 to proceed with deposition of titanium nitride material layer until all the wafers in the FOUP 100 have been deposited with a material layer (step 208). In the process of deposition reaction of the first wafer in the FOUP 100 to the last wafer in the FOUP 100, the FOUP 100 is filled with a gas. Gas enters the FOUP 100 via an inlet 104 connected to a gas supply device (not shown). The supplied gas is, for instance, inert gas (including nitrogen, helium, neon, argon, etc) or oxygen.

When nitrogen enters the FOUP 100, the gas originally existing in the FOUP 100 is discharged via an outlet 106 so that the nitrogen fills up the FOUP 100. Thus, the oxidation on the wafer surface is retarded and the increased resistance value due to oxidation is lowered and the surface properties of the first wafer in the FOUP 100 and the last wafer in the FOUP 100 are similar.

Since the wafer is stored in the FOUP 100 filled with nitrogen, the resistance value will be alike. These wafers possess low resistance value and the stability of the material layer on the wafer is increased. Besides, by purging with nitrogen, the reacting residual gas, for example chlorine, is discharged through the outlet 106 so as to lower contamination of other wafers due to outgassing.

When the gas passed through, for example, is oxygen, the extent of oxidation on the material layer surface is increased so that the extent of oxidation of the first wafer in the FOUP 100 and the last wafer is alike, and the resistance values are alike. These wafers have high resistance value which will increase the stability of the wafer surface in the FOUP. Besides, by the purging of oxygen, the reacting residual gas is discharged via the outlet 106 so as to reduce contamination of other wafers due to outgassing.

It is worth mentioning that the thermal treated wafer can be kept in a FOUP filled with nitrogen. The wafers are kept in an environment filled with gas, so not only is the wafer surface stable but also contamination as a result of outgassing is reduced.

In accordance with the present invention, different gas passed through the FOUP will cause different stabilizing effects. For instance, in forming a high resistance value or low resistance value wafer, regardless of the type of gas, the material layer can be stabilized.

The gas that passes through the FOUP can remove the reacting residual gas generated in the fabrication process so as to improve the outgassing effect of the wafer surface and reduce the possibility of contamination of the wafer. Thus, in the subsequent steps, the differences due to different surface properties are avoided. Thus, the precision of the fabrication process is improved.

Further, in accordance with the present invention, gas is directly filled in the FOUP. After the material layer is formed, a robot arm is used to directly transfer the wafer to the FOUP filled with gas until all the wafers have been treated. When this method is employed, expensive additional devices are not required and the problems of the conventional art can be solved, and the surface property of the wafer is stabilized and the yield and stability of the wafer are improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of stabilizing a material layer, comprising the steps of
   (a) providing a plurality of wafers;
   (b) transferring at least one of the wafers to a chamber;
   (c) treating the wafer within the chamber and forming a material layer over the wafer, wherein a material of the material layer is selected from the group consisting of metal nitrides and metal silicides;
   (d) transferring the treated wafer to a FOUP;
   (e) repeating steps (b) to (d) until all the wafers have been treated; and
   (f) purging a gas into the FOUP during the Steps (b) to (e) so that a property of the material layers of all the wafers is consistent.

2. The method of claim 1, wherein the material layer includes a titanium nitride film and the gas includes nitrogen so that the titanium nitride film on each wafer has a consistent low resistance value.

3. The method of claim 1, wherein the material layer includes a titanium nitride film and the gas includes oxygen so that the titanium nitride film on each wafer has a consistent high resistance value.

4. The method of claim 1, wherein the gas includes inert gas.

5. The method of claim 1, wherein the gas includes nitrogen.

6. The method of claim 1, wherein the gas includes oxygen.

7. The method of claim 1, wherein the metal silicides include tungsten silicides.

8. The method of claim 1, wherein the metal silicides include titanium silicides.

9. The method of claim 1, wherein the metal silicides include tantalum silicides.

* * * * *